(12) United States Patent
Dickey

(10) Patent No.: US 11,935,759 B2
(45) Date of Patent: Mar. 19, 2024

(54) HIGH VOLTAGE, LOW PRESSURE PLASMA ENHANCED ATOMIC LAYER DEPOSITION

(71) Applicant: LOTUS APPLIED TECHNOLOGY, LLC, Hillsboro, OR (US)

(72) Inventor: Eric R. Dickey, Hillsboro, OR (US)

(73) Assignee: Lotus Applied Technology, LLC, Hillsboro, OR (US)

( * ) Notice: Subject to any disclaimer, the term of this patent is extended or adjusted under 35 U.S.C. 154(b) by 233 days.

(21) Appl. No.: 16/866,497

(22) Filed: May 4, 2020

(65) Prior Publication Data
US 2020/0350179 A1 Nov. 5, 2020

Related U.S. Application Data

(60) Provisional application No. 62/842,039, filed on May 2, 2019.

(51) Int. Cl.
| | | |
|---|---|---|
| *C23C 16/34* | (2006.01) | |
| *C23C 16/40* | (2006.01) | |
| *C23C 16/455* | (2006.01) | |
| *C23C 16/503* | (2006.01) | |
| *H01L 21/02* | (2006.01) | |
| *H01L 21/441* | (2006.01) | |

(52) U.S. Cl.
CPC ............ *H01L 21/441* (2013.01); *C23C 16/34* (2013.01); *C23C 16/401* (2013.01); *C23C 16/402* (2013.01); *C23C 16/45542* (2013.01); *C23C 16/45553* (2013.01); *C23C 16/503* (2013.01); *H01L 21/0228* (2013.01)

(58) Field of Classification Search
None
See application file for complete search history.

(56) References Cited

U.S. PATENT DOCUMENTS

| | | | |
|---|---|---|---|
| 2002/0197402 A1* | 12/2002 | Chiang | ............... C23C 16/0227 |
| | | | 257/E21.171 |
| 2014/0273530 A1 | 9/2014 | Nguyen et al. | |
| 2016/0108524 A1* | 4/2016 | Dickey | ............. C23C 16/45555 |
| | | | 427/576 |
| 2016/0329206 A1* | 11/2016 | Kumar | .............. C23C 16/45529 |

OTHER PUBLICATIONS

Scott G. Walton, J.E. Greene, Chapter 2—Plasmas in Deposition Processes, Editor(s): Peter M. Martin, Handbook of Deposition Technologies for Films and Coatings (Third Edition), William Andrew Publishing, 2010, pp. 32-92, ISBN 9780815520313 (hereafter "Martin") (Year: 2010).*

(Continued)

*Primary Examiner* — Jose I Hernandez-Kenney
(74) *Attorney, Agent, or Firm* — Stoel Rives LLP

(57) ABSTRACT

Atomic layer deposition (ALD) methods and barrier films are disclosed. A method of performing ALD includes placing a substrate proximal an electrode coupled to a power supply, exposing the substrate to an oxygen-containing gas or a nitrogen-containing gas at or below 0.8 Torr, and applying, with the power supply, a voltage to the electrode of at least 700 Volts to induce a plasma state in the oxygen-containing gas or the nitrogen-containing gas proximal the substrate. High quality barrier films can be made with the methods.

21 Claims, 10 Drawing Sheets

(56) References Cited

OTHER PUBLICATIONS

Ochs et al. The Historical Development of HIPIMS Power Supplies: From Laboratory to Production. Society of Vacuum Coaters (2008). Available at https://svc.org (Year: 2008).*

Brown, Hayley Louise, "The Properties and Performance of Moisture/Oxygen Barrier Layers Deposited by Remote Plasma Sputtering", University of Surrey, 2015, 251 pages.

Deilmann, Michael, "Silicon oxide permeation barrier coating and sterilization of PET bottles by pulsed low-pressure microwave plasmas", Ruhr-University Bochum, Aug. 14, 2008, 142 pages.

Elam, Fiona M., et al., "Defect prevention in silica thin films synthesized using APPECVD for flexible electronic encapsulation", 2017, 11 pages.

WIPO, International Search Report and Written Opinion for Application No. PCT/US2020/031382, dated Jan. 14, 2021, 28 pages.

* cited by examiner

HIGH VOLTAGE, LOW PRESSURE PLASMA ENHANCED ATOMIC LAYER DEPOSITION

CROSS REFERENCE TO RELATED APPLICATIONS

This application claims the benefit of U.S. Provisional Patent Application No. 62/842,039 entitled "HIGH VOLTAGE, LOW PRESSURE PLASMA ENHANCED ATOMIC LAYER DEPOSITION," which was filed on May 2, 2019, which is hereby incorporated by reference in its entirety.

TECHNICAL FIELD

The present disclosure relates to barrier films and particularly to high voltage, low pressure plasma enhanced atomic layer deposition methods for forming such films and products and apparatuses related thereto.

BACKGROUND

Atomic layer deposition (ALD) may be used to deposit thin films for a variety of practical applications. One such application of ALD thin films is barrier materials.

ALD is similar to conventional chemical vapor deposition (CVD) processes but distinct in its self-limiting growth at the surface of the substrate on an atomic level. ALD is a process that generates thin films that are extremely conformal and highly dense, and provide pinhole-free coverage. A complete ALD cycle is often referred to as a combination of two half-reactions. A single ALD cycle generally includes four steps: (1) substrate exposure to gaseous precursor molecules that react with the substrate surface or other existing molecules on the surface ("reactive sites")—this is the first half-reaction; (2) purge any precursor molecules not chemically bonded to the surface; (3) introduce gaseous reactant molecules that react with precursor molecules and form the desired molecule on the surface—this is the second half-reaction; and (4) purge any reactant molecules that were not reacted and also purge any byproducts of reaction, leaving only the desired molecules on the surface, such as a metal oxide.

Certain materials may suffer from poor barrier characteristics. For example, an ALD-formed $SiO_x$ moisture barrier typically does not have a water vapor transmission rate (WVTR) of less than 0.5 grams per square meter per day ($g/m^2/day$). Sputtered $SiO_2$ has been reported as capable of achieving a WVTR as low as $5 \times 10^{-2}$ $g/m^2/day$. Plasma-enabled chemical vapor deposition of $SiO_x$ has been reported as capable of achieving a WVTR of $9 \times 10^{-2}$ $g/m^2/day$, for films over a micron thick. However, those $SiO_x/SiO_2$ films do not have low enough WVTRs to function as "ultrabarriers."

A need exists for alternative ALD processes and high-quality barrier films.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Embodiments disclosed herein include ALD apparatuses, barrier materials, and related methods. It was discovered that by exposing a substrate to an oxygen-containing or nitrogen-containing plasma at low pressure (e.g., 0.1 to 0.8 Torr) and high voltage that the water vapor and oxygen transmission rates may be significantly reduced, the density increased, and the stress reduced, as compared to barrier films deposited using conventional ALD processes. Also, it was observed that exposure time to a plasma may be reduced as compared to that of conventional ALD processes. Accordingly, ALD barriers formed according to embodiments disclosed herein demonstrate superior barrier characteristics as compared to conventional ALD barriers and may be produced with increased throughput.

It was observed that when low pressure and high voltage were used, barriers having water vapor transmission rates of on the order of $10^{-4}$ or less may be achieved. Additionally, etch rates are reduced, suggesting increased density of the films. When $SiO_x$ is deposited according to embodiments disclosed herein, the $SiO_x$ is more chemically resistant than conventionally deposited $SiO_x$, and is more abrasion resistant. Also, using embodiments disclosed herein, polymers may be coated on without pre-drying.

The low pressure, high voltage plasma can be achieved by operating a plasma generator at high voltage (e.g., at least 700 Volts) on one or more electrodes of the plasma generator proximate to the substrate).

As used herein, the terms "electrode" and "electrodes" refer specifically to the area of the electrode that is generating the plasma itself. It is common for electrodes to be larger than the area that is actually emitting the plasma, but much of the area has a "dark space shield", which is close enough in proximity to the electrode to prevent plasma generation. This is generally used to prevent plasma generation on the sides or rear surfaces of the electrode(s). Accordingly, the term "electrode," refers only to the portion of the electrode that is actually emitting the plasma and excludes any passive portions such as the "dark space shield."

Generally speaking, the term "substrate" refers to a base substrate material and any other material or chemical carried thereon (e.g., a base substrate material with one or more films grown or partially grown on it). For example, devices may be formed on or in a surface of a semiconductor substrate and considered part of the "substrate" for the purposes of this disclosure. Unless specifically identified otherwise, when referring to this "substrate," the base semiconductor material and the devices and layers carried therein and thereon would be included in the "substrate."

Figure 1:
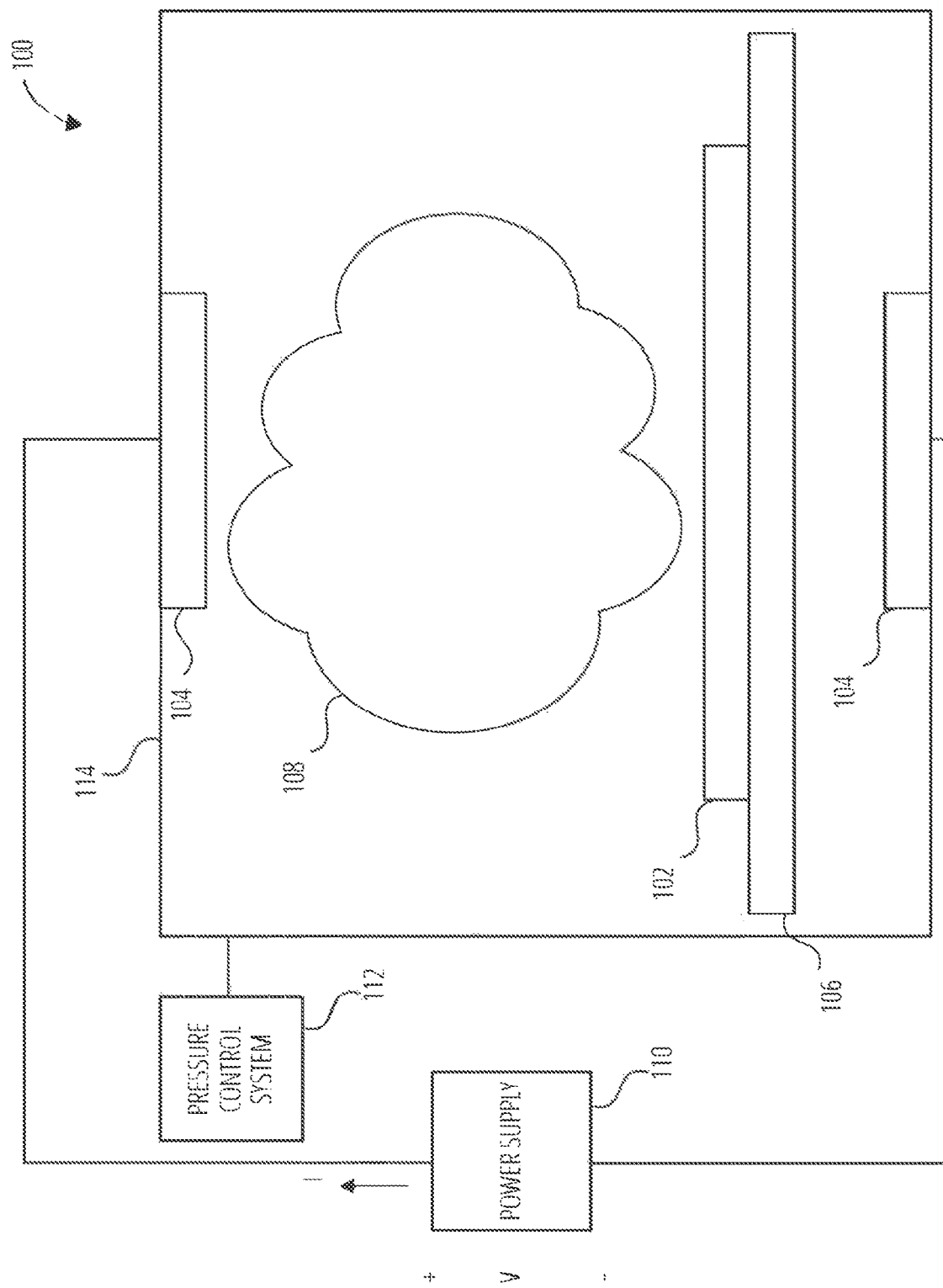
FIG. 1 is a side view of an ALD apparatus, according to some embodiments.

FIG. 1 is a side view of an ALD apparatus 100, according to some embodiments. The ALD apparatus 100 includes a reaction chamber 114, a pedestal 106 within the reaction chamber 114, and a pressure control system 112 configured to control a pressure of an oxygen-containing gas or nitrogen-containing gas 108 (also referred to herein as a process gas—not to be confused with the purge gas) within the reaction chamber 114. The pedestal 106 is configured to hold a substrate 102 thereon while the reaction chamber 114 exposes the substrate 102 to the oxygen-containing gas or nitrogen-containing gas 108. The substrate 102 may include a chemisorbed metal precursor chemisorbed thereon. The ALD apparatus 100 also includes a plasma generator including a power supply 110 operably coupled to electrodes 104. The electrodes 104 are proximal to the pedestal 106 (e.g., such that an electrode-to-substrate distance between at least one of the electrodes 104 and the substrate 102 is five centimeters (5 cm) or less). The plasma generator is configured to induce a plasma state in the oxygen-containing gas or nitrogen-containing gas 108, thereby resulting in some of the chemicals of the oxygen-containing gas or nitrogen-containing gas 108 (e.g., radical oxygen or nitrogen species) reacting with the chemisorbed metal precursor on the substrate 102 to form an oxide or a nitride (e.g., by "burning off" other ligands and atoms on the metal precursor).

The ALD apparatus 100 is configured to enable at least a portion of an ALD process to deposit a film (e.g., a moisture barrier, an oxygen barrier, etc.) on the substrate 102. During the portion of the ALD process, the pressure control system 112 is configured to maintain a relatively low pressure within the reaction chamber 114 while the power supply 110 is configured to maintain a relatively high voltage applied to the oxygen-containing gas or nitrogen-containing gas 108. In some embodiments the pressure control system 112 may include a gas delivery system having a controllable pumping speed wherein the pressure may be controlled by varying the gas flow to modulate the pressure. In some embodiments, a feedback system such as a variable throttle valve or variable flow valve in feedback with a pressure sensor configured to sense the pressure of the gas 108 may be used. By way of non-limiting example, the pressure control system 112 may maintain the pressure within the reaction chamber 114 at or below 0.8 Torr while the power supply 110 maintains a voltage of at least 700 Volts. Importantly, as the pressure is modulated, the power is held constant, such that the voltage is changed. The change in voltage can be manual or automatic in response to changes in pressure. In some embodiments the pressure control system 112 may be configured to maintain a pressure of the oxygen-containing gas or nitrogen-containing gas 108 at 0.1 Torr to 0.8 Torr. In some embodiments the pressure control system 112 may be configured to maintain a pressure of the oxygen-containing gas or nitrogen-containing gas 108 at 0.2 Torr to 0.7 Torr. In some embodiments the pressure control system 112 may be configured to maintain a pressure of the oxygen-containing gas or nitrogen-containing gas 108 at 0.3 Torr to 0.4 Torr. In some embodiments, the pressure control system 112 may be configured to maintain a pressure of the oxygen-containing gas or nitrogen-containing gas 108 at 0.4 Torr to 0.6 Torr. In some embodiments, the pressure control system 112 may be configured to maintain a pressure of the oxygen-containing gas or nitrogen-containing gas 108 at a nominal value of 0.5 Torr.

In some embodiments, the oxygen-containing gas or nitrogen-containing gas 108 is unreactive with a metal precursor unless radicalized by the plasma. Likewise, the oxygen-containing gas or nitrogen-containing gas 108 may also be unreactive with deposited metal (e.g., chemisorbed metal precursor) on the substrate 102 and the base material of the substrate 102 (e.g., polymer substrate) unless radicalized by the plasma. In some embodiments, any portion of the film growth resulting from reaction with non-radicalized species is less than ten percent (10%) of the total film. This could be measured by running the process without the plasma and measuring the growth rate of any component (which would likely be a CVD component) and then running the process with the plasma and measuring the total growth rate. Comparing the growth rate without the plasma and with the plasma would give the percentage of the film resulting from reaction with non-radicalized species. In some embodiments, the oxygen-containing gas or nitrogen-containing gas 108 includes an oxygen-containing gas (e.g., including air, $O_2$, CO, $CO_2$, NO, $N_2O$, $NO_2$, or mixtures of the foregoing). In some embodiments, the oxygen-containing gas or nitrogen-containing gas 108 includes a nitrogen-containing gas (e.g., including $N_2$, $NH_3$, $N_2$:$H_2$ mixtures, and mixtures of the foregoing). In some embodiments, the oxygen-containing gas or nitrogen-containing gas 108 includes mixtures of oxygen-containing gas and nitrogen-containing gas.

In some embodiments, the gaseous metal precursor comprises an amino-based silicon precursor (e.g., including at least one nitrogen atom directly bonded to a silicon atom). In some embodiments, the amino-based silicon precursor is selected from bisdiethylaminosilane (BDEAS), ORTHRUS (from Air Liquide), trisdiethylaminosilane (TDMAS or 3DMAS), bistertbutylaminosilane (BTBAS), diisopropylaminosilane (DIPAS), bisdiisoproplyaminodislane (BDIPADS), trisilylamine (TSA), neopentasilane, $N(SiH_3)_3$, tris (isopropylamino)silane (TIPAS), bis (ethylmethylaminosilane (BEMAS), and di-isotpropylaminotrichlorosilane (DIPATCS).

Examples of gaseous titanium precursors include titanium tetraisopropoxide (TTIP), $TiCl_4$, and tetrakisdimethylamindotitatium (TDMAT). Examples of gaseous niobium precursors include tertbutylamidotrisdiethylaminoniobium (TBTDEN), Niobium Ethoxide, tertbutylamidotrisethylmethylaminoniobium (TBTEMN), and pentakisdimethylamidotantalum (PDMAT). Examples of tantalum precursors include analogs of the foregoing for tantalum. Examples of Hafnium include tetrakisethylmethylamidohafnium (TEMAH), tetrakisdiethylamidohafnium (TDEAH), and tetrakisethylmethylamidohafnium (TDMAH), HyALD (from Air Liquide). Examples of Zirconium precursors include analogs of the foregoing for zirconium.

In some embodiments, the electrodes 104 include a cathode and an anode. In some embodiments, a negative voltage is applied to the plasma electrode 104 (e.g., the electrode 104 that is closest to the substrate 102) and the other electrode 104 is held at ground (e.g., zero volts). The reaction chamber may also be grounded so that random surfaces in the chamber may act as an effective anode and there is only one electrode 104. In some embodiments, at least one of the electrodes 104 is separated from the substrate 102 by five centimeters (5 cm) or less (e.g., the electrode 104 in contact with the oxygen-containing gas or nitrogen-containing gas 108 and opposing the to be coated surface of the substrate 102). In some embodiments, at least one of the electrodes 104 is separated from the substrate 102 by 0.1 cm to 5 cm, 0.2 centimeters (0.2 cm) to two centimeters (2 cm). In some embodiments, at least one of the electrodes 104 is separated from the substrate 102 by 0.3 centimeters (0.3 cm) to two centimeters (2 cm). The spacing, pressure, voltage, and power are selected so that the plasma entirely occupies the space between the substrate 102 and the electrode 104 opposing the to be coated surface of the substrate. This can be determined by optical inspection of the plasma glow. Other methods known in the art for determining the extent of plasma can also be used.

Figure 2:
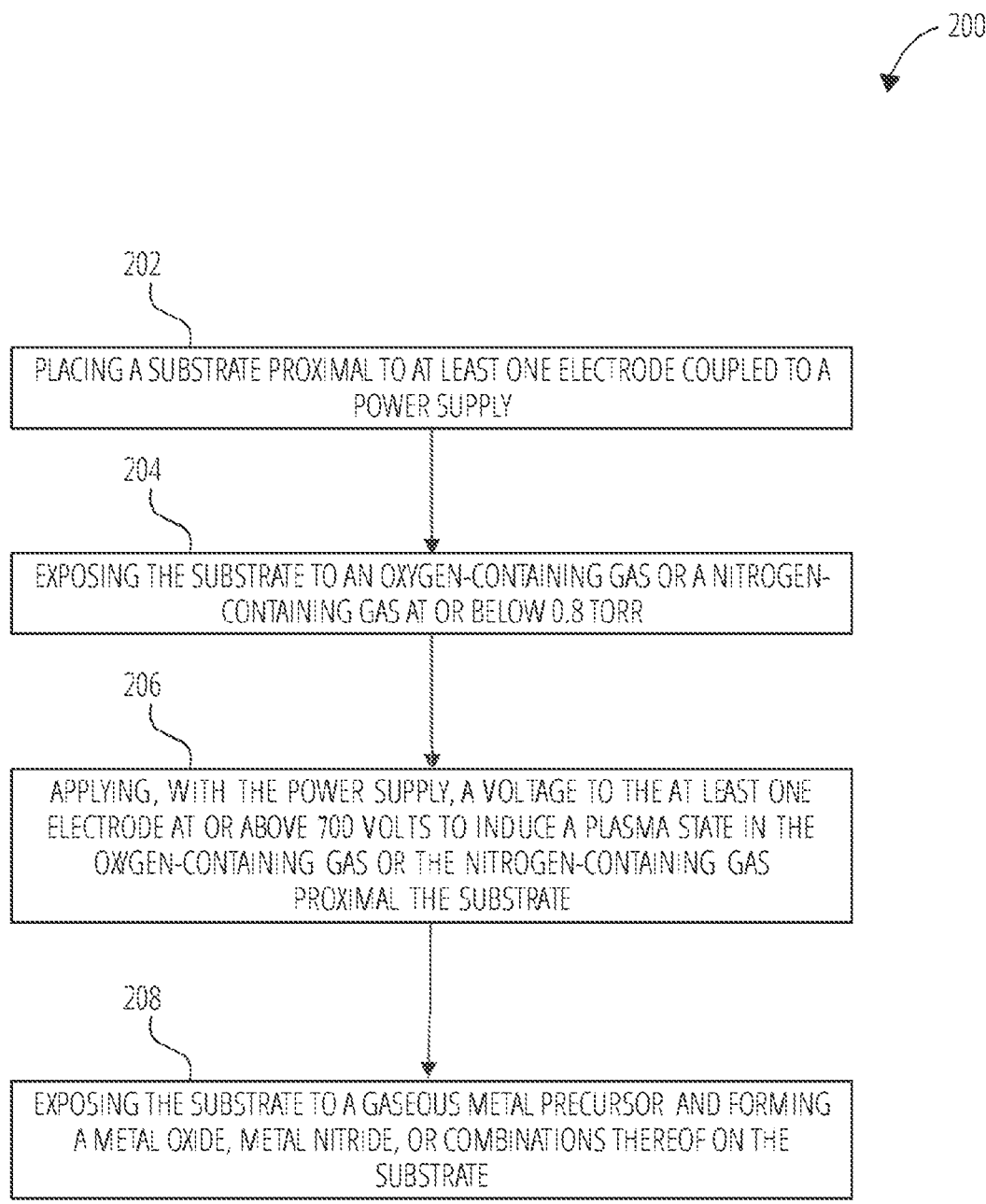
FIG. 2 is a flowchart illustrating a method of performing ALD, according to some embodiments.

FIG. 2 is a flowchart illustrating a method 200 of performing ALD, according to some embodiments. Referring to FIG. 1 and FIG. 2 together, the method 200 includes placing 202 the substrate 102 proximal at least one of the electrodes 104, which are operably coupled to the power supply 110.

The method 200 also includes exposing 204 the substrate 102 to the oxygen-containing gas or nitrogen-containing gas 108 at or below 0.8 Torr. In some embodiments, exposing the substrate 102 to an oxygen-containing gas or nitrogen-containing gas 108 at or below 0.8 Torr includes introducing the precursor gas to the substrate 102 at a nominal value of 0.1 Torr.

In some embodiments, exposing 204 the substrate 102 to the oxygen-containing gas or nitrogen-containing gas 108 includes exposing the substrate 102 to the oxygen-containing gas or nitrogen-containing gas 108 at a first pressure at or below 0.8 Torr during formation of a first film on the substrate 102, and exposing the substrate 102 to the oxygen-containing gas or nitrogen-containing gas 108 at a second pressure at or below 0.8 Torr during formation of a second film on the substrate 102. The first film has a first type of stress, and the second film has a second type of stress that is different from the first type of stress. In some embodiments, the second type of stress at least partially cancels out the first type of stress. By way of non-limiting example, the first type of stress may include a tensile stress and the second type of stress may include a compressive stress. Also by way of non-limiting example, the first type of stress may include a compressive stress and the second type of stress may include a tensile stress.

The method 200 further includes applying 206, with the power supply 110, a voltage to the electrodes 104 at or above 700 Volts (such as, for example, 700 Volts to 1500 Volts) to induce a plasma state in the oxygen-containing gas or nitrogen-containing gas 108 proximal the substrate 102. In some embodiments, applying 206 a voltage to the at least one electrode 104 includes applying pulsed or continuous direct current (DC) voltage or alternating current (AC) voltage at a frequency of less than 500 kHz, including less than 100 kHz. In some embodiments, high power pulses (e.g., in excess of 20 W/cmw) with relatively low duty cycles, such as those used in high-power pulsed magnetron sputtering (HIPIMS) may be used to supply the high voltage, so long as the average power is held constant.

In some embodiments, the method 200 also includes exposing 208 (e.g., subsequent to the exposing 204) the substrate 102 to a gaseous metal precursor and forming a metal oxide, a metal nitride, or combinations thereof on the substrate 102. The exposing 204, 208 and applying 206 acts may be repeated to grow a metal oxide film, a metal nitride film, or combinations thereof, on the substrate 102. In some embodiments, exposing 204 the substrate 102 to the oxygen-containing gas or nitrogen-containing gas 108 occurs in a plasma zone, and subsequently exposing 208 the substrate to the gaseous metal precursor occurs in a precursor zone. In some such embodiments, repeating the exposing 204, 208 acts and the applying 206 act includes repeatedly transporting the substrate 102 from the plasma zone to the precursor zone. In some embodiments, exposing 208 the substrate 102 to the gaseous metal precursor occurs at a higher pressure than exposing 204 the substrate 102 to the oxygen-containing gas or nitrogen-containing gas 108.

It should be understood that the method 200 steps through a single ALD cycle. The steps of the method 200 will typically be repeated numerous times while growing a thin film. It was discovered that by varying the voltage and pressure, while maintaining a constant power of the power supply, a stress of a resulting film could be controlled. Accordingly, methods of modulating the stress of a thin film using the method 200 are contemplated herein.

For example, methods of modulating stress in a thin film include providing a plasma-enabled atomic layer deposition (ALD) reactor with a DC power supply or relatively low frequency AC power supply (non-RF frequencies) and placing a substrate proximal at least one electrode coupled to the power supply of the ALD reactor. Next, exposing the substrate to an oxygen-containing gas or a nitrogen-containing gas at a first pressure at or below 0.8 Torr and applying, with the power supply, a first voltage to the at least one electrode of at least 700 Volts to induce a plasma state in the oxygen-containing gas or the nitrogen-containing gas proximal the substrate. Subsequently exposing the substrate to a gaseous metal precursor and forming a metal oxide, metal nitride, or combinations thereof on the substrate. Repeating the exposing acts to grow a metal oxide film, metal nitride film, or combinations thereof, on the substrate to form a first film having a first type of stress. Next, modulating the first pressure to a second pressure at or below 0.8 Torr and modulating the first voltage to a second voltage of at least 700 Volts, wherein the first voltage and the second voltage are applied at the same power over time or the same average power over time. Exposing the substrate to an oxygen-containing gas or a nitrogen-containing gas at the second pressure and applying, with the DC power supply, the second voltage to the at least one electrode to induce a plasma state in the oxygen-containing gas or the nitrogen-containing gas proximal the substrate. Subsequently exposing the substrate to a gaseous metal precursor and forming a metal oxide, metal nitride, or combinations thereof on the substrate. Repeating the exposing acts to grow a metal oxide film, metal nitride film, or combinations thereof, on the substrate to form a second film having a second type of stress, wherein a final film comprising the first film and the second film has a different amount, type, or both of stress from the first film.

One of the benefits of the foregoing method is that the final thin film can have low stress, such as, for example, a neutral stress, a tensile stress less than 200 MPa, less than 150 MPa, or less than 100 MPa, or a compressive stress less than −200 MPa, less than −150 MPa, or less than −100 MPa. In contrast, conventional ALD typically produces films with high tensile stress.

Another benefit of the foregoing method is that the resulting thin film tends to be more dense than conventional ALD films. For example, the final thin film (and each of its one or more thin films) can have a density of greater than 90%, greater than 95%, of 96%, of 97%, of 98% or of 99% of theoretical bulk density. The theoretical bulk density is the ideal density for the material. For a crystalline material, this is the ideal crystalline density with the atomic separation you would find in a naturally occurring crystal. For materials that are generally amorphous, such as amorphous $SiO_2$, the theoretical bulk density refers to that of thermally grown $SiO_2$ on silicon, or "fused silica", which is a synthetically fabricated amorphous $SiO_2$. Surprisingly, both low stress and high density can be achieved using the methods disclosed herein. This has not been achieved with any other thin film deposition technology.

Additionally, the benefits of low stress and high density can be maintained for relatively thick thin films, such as unitary films having a thickness of at least 10 nm, at least 20 nm, at least 50 nm, at least 100 nm, at least 150 nm, at least 200 nm, at least 500 nm, at least 1 micron, at least 1.5 microns, at least 2 microns, or at least 3 microns.

The final thin film can include multiple thin films. It should be understood that the final thin film could contain only a single thin film, when it was not desired to modulate the stress of the first thin film, such as when the first thin film is produced with a neutral stress. Or, such as when the underlying substrate is under stress and the first thin film is sufficient to neutralize the stress of substrate.

It should be understood that for the different thin films of the final thin film, the same or different gaseous metal-containing precursors may be used.

Figure 3:
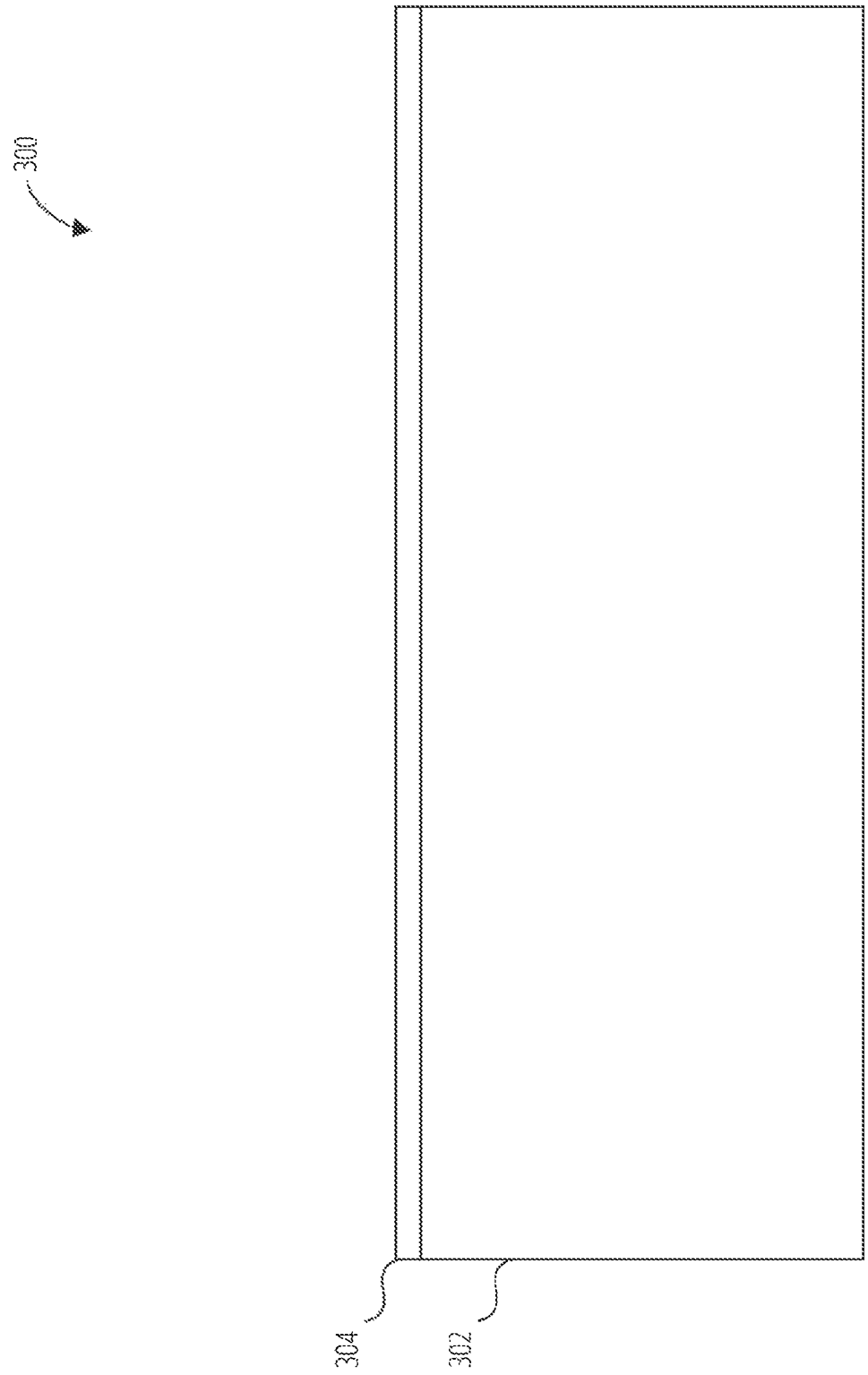
FIG. 3 is a cross-sectional view of a substrate with film, according to some embodiments.

FIG. 3 is a cross-sectional view of a substrate with film 300, according to some embodiments. The substrate with film 300 includes a substrate 302 and a film 304. The film 304 was formed according to the method 200 of FIG. 2, using the ALD apparatus 100 of FIG. 1. In some embodiments the substrate 302 includes a flexible polymer film having a glass transition temperature of 100° C. or less. In some embodiments the film 304 has a refractive index of 1.45 or more, such as 1.45 to 1.55 at 633 nm, indicating a high density $SiO_x$ film. In some embodiments the substrate 302 is rigid. In some embodiments the substrate 302 includes an organic light emitting diode (OLED) display, optical device, optical coating, or optical interference filter. In some embodiments, the substrate 302 includes a lighting panel. In some embodiments the substrate 302 includes a substrate of an electronic device (e.g., a printed circuit board carrying one or more circuit components such as semiconductor packages, a semiconductor device substrate, etc.). In some embodiments the substrate 302 includes a semiconductor material such as silicon, gallium arsenide, a III-V semiconductor material, a II-VI semiconductor material, a silicon on insulator (SOI) substrate, a silicon on glass substrate, a silicon on sapphire (SAS substrate), other semiconductor materials, or combinations thereof. In some embodiments, the substrate 302 may include one or more semiconductor devices formed therein or thereon.

In some embodiments the film 304 may be less than or equal to 500 Angstroms thick. In some embodiments, the film 304 includes a barrier (e.g., a moisture barrier, an oxygen barrier, etc.) formed on the substrate 302. Beneficially, using the methods disclosed herein, the barrier may be formed at 150° C. or less (such as 120° C. or less and 100° C. or less) from alternating exposure of the substrate 302 to a gaseous silicon-containing precursor and a low-pressure oxygen plasma (having a pressure of 0.1 Torr to 0.8 Torr). This can allow growth of the thin films on temperature-sensitive substrates, such as flexible, polymer substrates with a relatively low-melting point. As a specific, non-limiting example, the film 304 may include a thin film barrier including silicon and oxygen (e.g., silicate, $SiO_x$ where "x" is a value ranging from 1 to 2, such as, 1.6, 1.8, etc.). In some embodiments, the film 304 has a water vapor transmission rate of $3\times10^{-3}$ grams per meter squared per day ($g/m^2/day$) or less, $5\times10^{-5}$ $g/m^2/day$ or less, or $1\times10^{-6}$ $g/m^2/day$ or less. In some embodiments the film 304 is greater than 300 nm thick and has a water vapor transmission rate of $3\times10^{-3}$ $g/m^2/day$ or less, $5\times10^{-5}$ $g/m^2/day$ or less, or $1\times10^{-6}$ $g/m^2/day$ or less. In some embodiments the film 304 is greater than 300 nm thick and has an oxygen vapor transmission rate of $5\times10^{-3}$ $cm^3/m^2/day$ or less. In some embodiments the film 304 has a refractive index of 1.45 or more at 633 nm. The higher the refractive index, the more dense the film 304. Increased density suggests the film 304 has lower porosity, which corresponds to a reduced WVTR and oxygen permeability. For example, the film 304 may have a density of at least 90% the theoretical bulk density. Additionally, the film 304 may have low stress.

Figure 5:
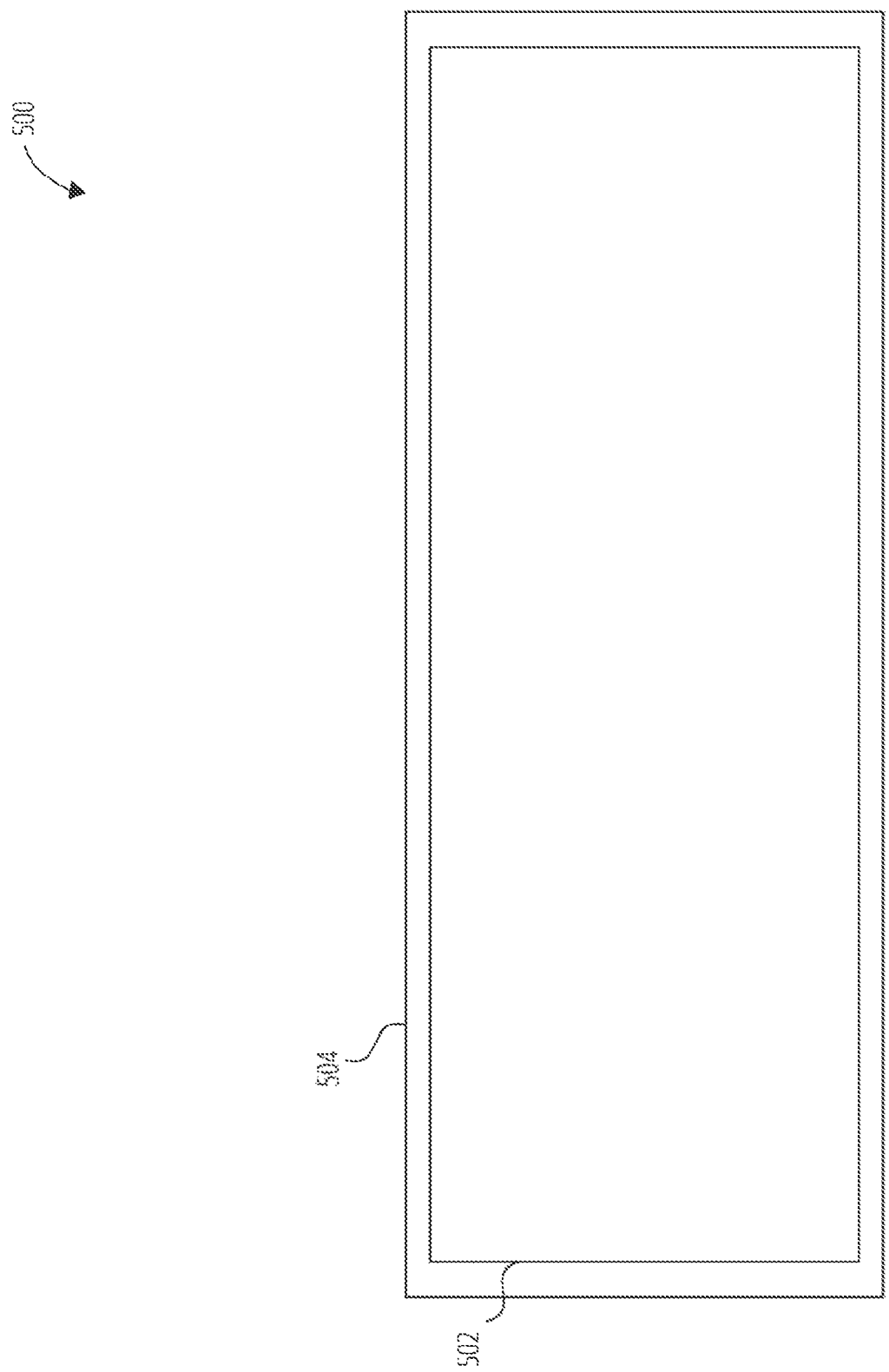
FIG. 5 is a cross-sectional view of a substrate with film, according to some embodiments.

In some embodiments the film 304 may be formed directly on the substrate 302. In some embodiments, however, the film 304 may be formed directly on one or more intervening layers. FIG. 5 illustrates one such example embodiment. In some embodiments the substrate 302 may not be cleaned or pretreated prior to formation of the film 304.

In some embodiments the film 304 includes a barrier formed on the substrate 302. The barrier includes a thin film of $SiO_x$ formed at 150° C. or less from alternating exposure of the substrate 302 to a gaseous silicon-containing precursor and a low-pressure, high voltage oxygen plasma. The thin film of $SiO_x$ is less than 500 Angstroms thick and has a water vapor transmission rate of $3\times10^{-3}$ $g/m^2/day$ or less, $5\times10^{-5}$ $g/m^2/day$ or less, or $1\times10^{-6}$ $g/m^2/day$ or less, wherein the low-pressure oxygen plasma comprises an oxygen plasma at or below 0.8 Torr.

In some embodiments the film 304 includes a barrier formed on the substrate 302. The barrier includes a thin film of $SiO_x$ formed at 150° C. or less from alternating exposure of the substrate 302 to a gaseous silicon-containing precursor and a low-pressure, high-voltage oxygen plasma. The thin film of $SiO_x$ is greater than 300 nm thick and has a water vapor transmission rate of $3\times10^{-3}$ $g/m^2/day$ or less, $5\times10^{-5}$ $g/m^2/day$ or less, or $1\times10^{-6}$ $g/m^2/day$ or less.

In some embodiments the film 304 includes a reaction product including the product of exposure of a sorbed silicon-containing precursor to a low-pressure oxygen plasma having a pressure of 0.1 Torr to 0.8 Torr. The sorbed silicon-containing precursor is sorbed to the substrate 302 at a temperature of 150° C. or less.

Figure 4:
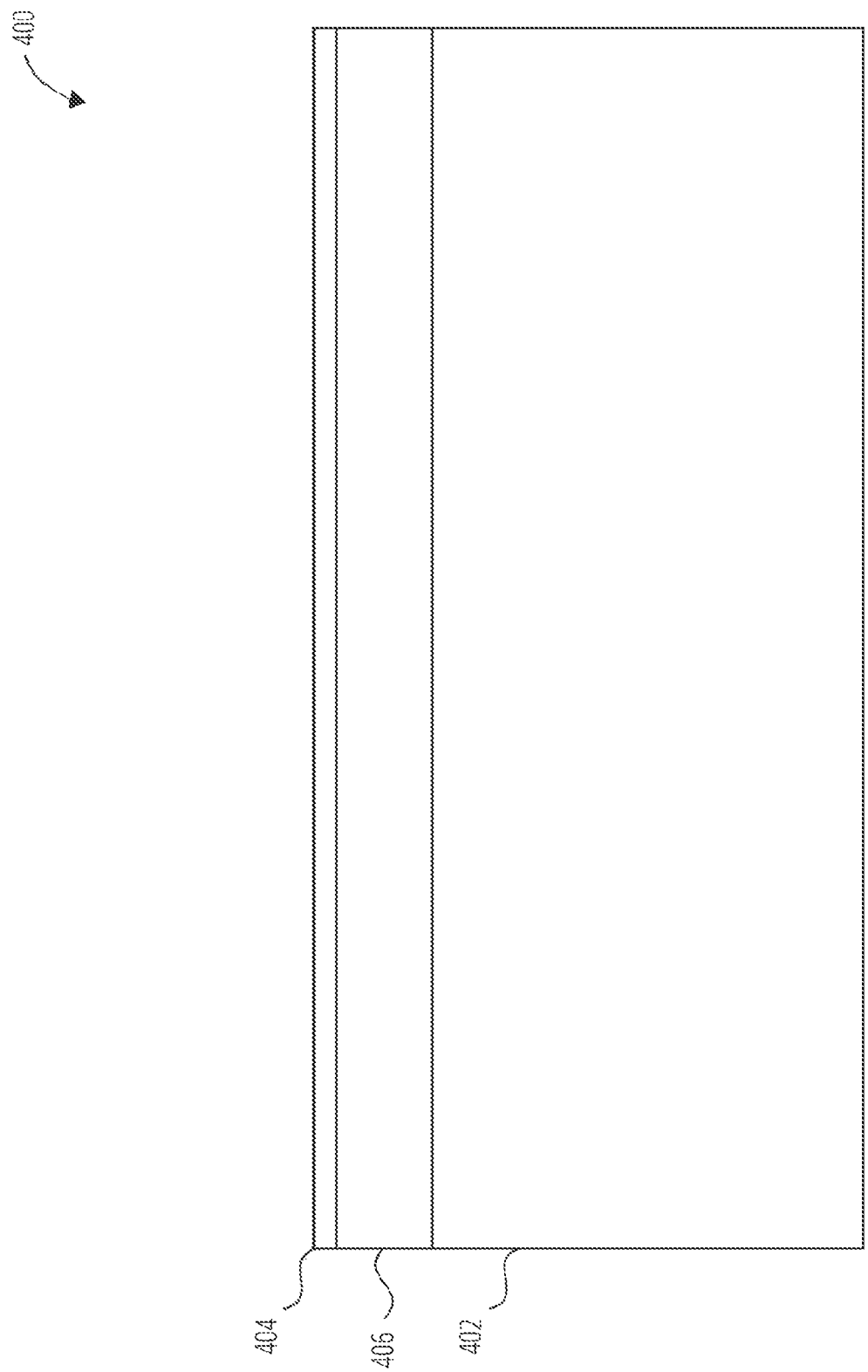
FIG. 4 is a cross-sectional view of a substrate with film, according to some embodiments.

FIG. 4 is a cross-sectional view of a substrate with film 400, according to some embodiments. The substrate with film 400 includes a substrate 402 and a film 404, similar to the substrate 302 and film 304 of FIG. 3. However, the substrate with film 400 includes an organic smoothing layer 406. The organic smoothing layer 406 is configured to compensate for any imperfections in the surface of the substrate 402.

FIG. 5 is a cross-sectional view of a substrate with film 500, according to some embodiments. The substrate with film 500 may be similar to the substrate with film 300 of FIG. 3 and/or the substrate with film 400 of FIG. 4. The substrate with film 500 includes a substrate 502 and a film 504. The substrate 502 is encapsulated within the film 504.

Figure 6:
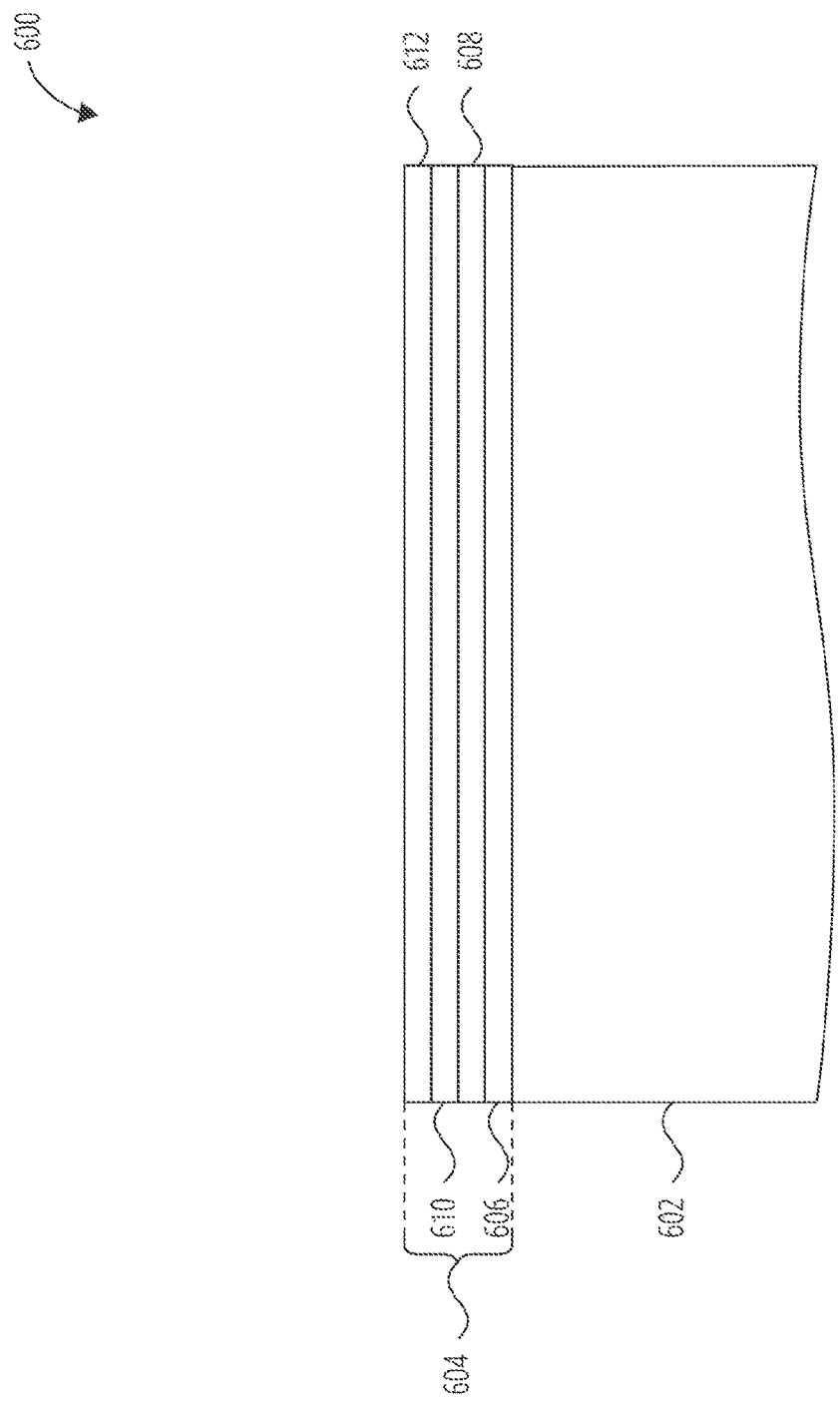
FIG. 6 is a cross-sectional view of a substrate with film, according to some embodiments.

FIG. 6 is a cross-sectional view of a substrate with film 600, according to some embodiments. The substrate with film 600 includes a substrate 602 and a film 604 formed thereon according to embodiments disclosed herein. The substrate 602 and film 604 may be similar to the film 304 of FIG. 3, the film 404 of FIG. 4, and the film 504 of FIG. 5. In some embodiments the film 604 may include a plurality of layers. One or more of these layers may be formed via a pairing of an exposure of the substrate 602 to a metal precursor and an exposure of the substrate 602 to an oxygen-containing gas or nitrogen-containing gas 108 (FIG. 1). For example, FIG. 6 illustrates the film 604 having four layers, namely layer 606, layer 608, layer 610, and layer 612. It is within the scope of the present disclosure that the film 604 may include any number of layers greater than or equal to two.

As discussed above, it was discovered that by varying the pressure of the oxygen-containing gas or nitrogen-containing gas 108 within the range of 0.1 Torr to 0.8 Torr and correspondingly varying the voltage, while maintaining a constant power of the power supply, a stress of a resulting film 604 deposited on the substrate 602 could be controlled. As a result, a stress in each of the layers 606, 608, 610, 612 may be controlled to cancel a stress of an underlying or overlying material. For example, a stress of the layer 606 may be of a first type and a stress of the layer 608 may be of a second type that is different from the first type. As a specific, non-limiting example, the second type of stress may include a tensile stress and the first type of stress may include a compressive stress. As another specific, non-limiting example, the second type of stress may include a compressive stress and the first type of stress may include a tensile stress. In some such embodiments, the pressure of the oxygen-containing gas or nitrogen-containing gas 108 used to form each of the layers 606, 608, 610, 612 may be selected to control the stresses of the layers 606, 608, 610, 612 to be neutral.

In some embodiments, one or more of the layers 606, 608, 610, 612 may include a material that is the same as one or more others of the layers 606, 608, 610, 612. By way of non-limiting example, each of the layers 606, 608, 610, 612 may include the same material. In some embodiments one or more of the layers 606, 608, 610, 612 may include a material that is different from one or more others of the layers 606, 608, 610, 612. By way of non-limiting example, one of the layers 606, 608, 610, 612 may include $SiO_x$ and another of the layers 606, 608, 610, 612 may include $Nb_yO_z$, where "y" is close to 2 and "z" ranges from 1 to 5.

In some embodiments, the substrate 602 may have a different coefficient of thermal expansion (CTE) than that of the film 604. The pressure may be selected to induce an intrinsic stress at an elevated temperature of deposition such that the CTEs of the substrate 602 and the film 604 are balanced when the substrate with film 600 is cooled. This embodiment extends to embodiments where the film only has a single layer. In other words, even where a single layer of the film is deposited on the substrate, the pressure may be selected to balance the CTEs of the substrate and the film when cooled.

Figure 7:
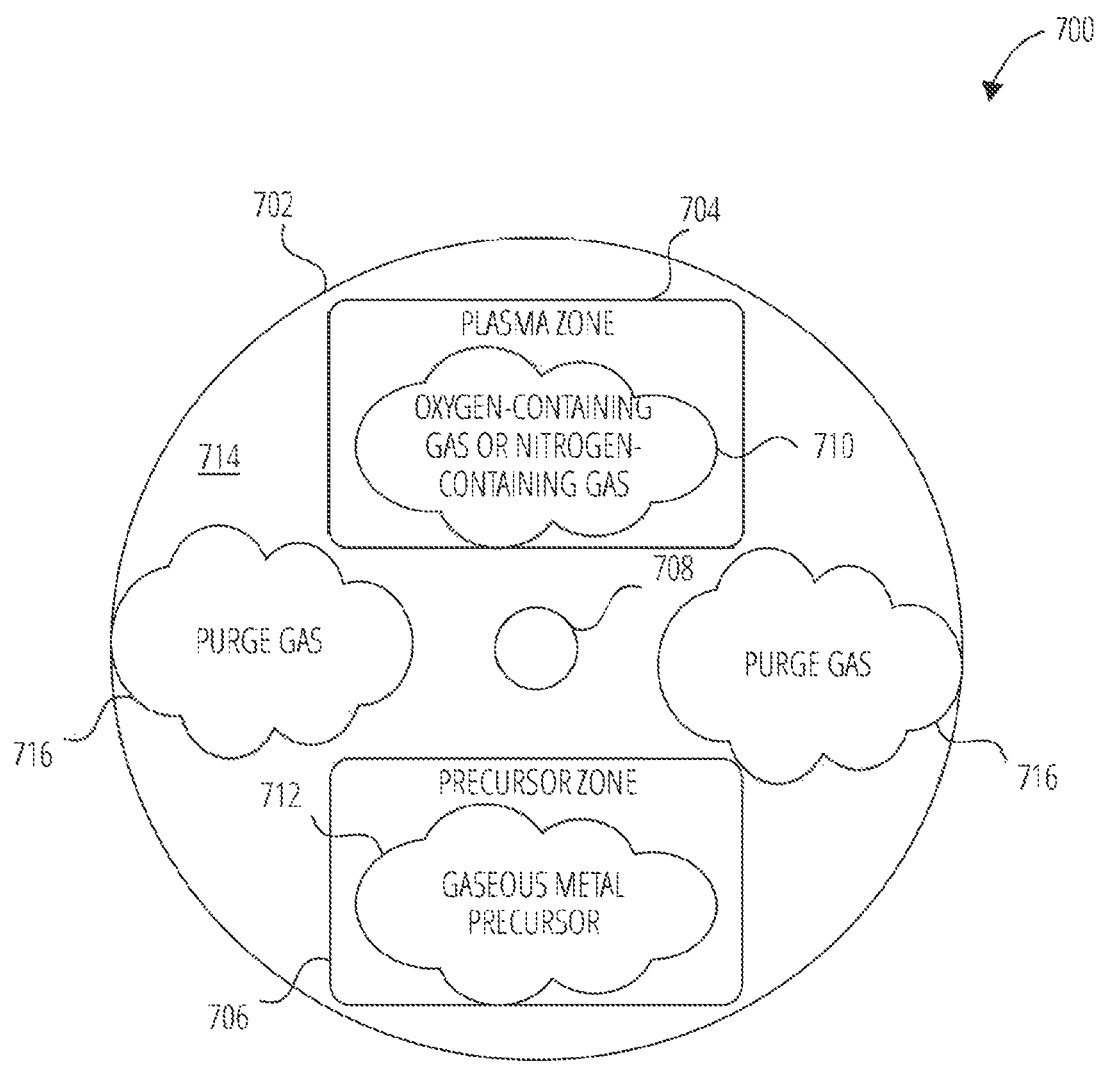
FIG. 7 is a top view of an ALD apparatus, according to some embodiments.

FIG. 7 is a top view of an ALD apparatus 700, according to some embodiments. The ALD apparatus 700 includes a plasma zone 704, a precursor zone 706, and a transportation device configured to transport a substrate between the plasma zone 704 and the precursor zone 706. The plasma zone 704 may include the ALD apparatus 100 discussed above with respect to FIG. 1. Specifically, the plasma zone 704 includes an oxygen-containing gas or nitrogen-containing gas 710 similar to the oxygen-containing gas or nitrogen-containing gas 108 of FIG. 1. The pressure of the oxygen-containing gas or nitrogen-containing gas 710 and power of a plasma generator at the plasma zone 704 may be controlled in accordance with embodiments disclosed herein. For example, the pressure may be maintained within a range of 0.1 Torr to 0.8 Torr and the surface power density may be maintained greater than or equal to 1 W/cm$^2$.

The precursor zone 706 may be similar to the plasma zone 704 except a plasma generator may or may not be used. Also, a pressure control system may or may not be used. The precursor zone 706 is configured to expose a substrate to a gaseous metal precursor 712. In some embodiments, a pressure of the gaseous metal precursor 712 within the precursor zone 706 is the same as a pressure of the oxygen-containing gas or nitrogen-containing gas 710 within the plasma zone 704. In some embodiments, the pressure of the gaseous metal precursor 712 of the precursor zone 706 is different from the pressure of the oxygen-containing gas or nitrogen-containing gas 710 of the plasma zone 704.

The transportation device of the ALD apparatus 700 of FIG. 7 includes a rotation member 702 configured to rotate around a pivot 708. One or more substrates to be processed may be coupled (e.g., using vacuum-induced suction, electromagnets, clamps, gravity, etc.) to a surface 714 of the rotation member 702. As the rotation member 702 rotates around the pivot 708, the one or more substrates may alternate between the plasma zone 704 and the precursor zone 706. In some embodiments, a purge gas 716 may be located between the plasma zone 704 and the precursor zone 706 to purge any residual chemicals from the substrates as they move between the plasma zone 704 and the precursor zone 706 with rotation of the rotation member 702.

In some embodiments a speed of rotation of the rotation member 702 may be controlled to provide a desired amount of time of exposure of the substrates to the oxygen-containing gas or nitrogen-containing gas 710 of the plasma zone 704 and the gaseous metal precursor 712 of the precursor zone 706.

Figure 8:
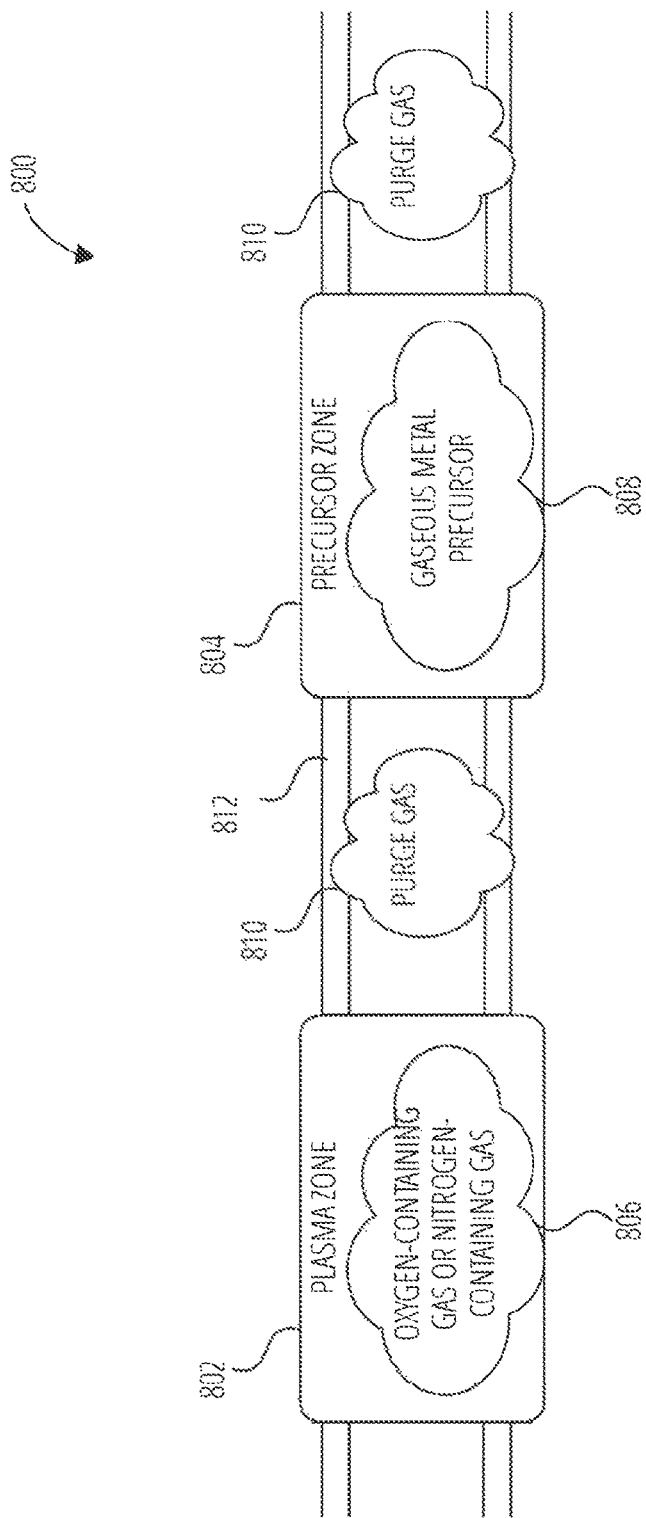
FIG. 8 is a top view of an ALD apparatus, according to some embodiments.

FIG. 8 is a top view of an ALD apparatus 800, according to some embodiments. The ALD apparatus 800 includes a plasma zone 802, a precursor zone 804, and a transportation device configured to transport one or more substrates between the plasma zone 802 and the precursor zone 804. A purge gas 810 may be located between the plasma zone 802 and the precursor zone 804. The plasma zone 802 and the precursor zone 804 may be similar to the plasma zone 704 and the precursor zone 706, respectively, of the ALD apparatus 700 of FIG. 7. In other words, the plasma zone 802 is configured to expose the substrates to an oxygen-containing gas or nitrogen-containing gas 806 similar to the oxygen-containing gas or nitrogen-containing gas 710, and the precursor zone 804 is configured to expose the substrates to a gaseous metal precursor 808 similar to the gaseous metal precursor 712.

The transportation device of the ALD apparatus 800 of FIG. 8 includes a conveyer system 812 configured to transport the one or more substrates between the plasma zone 802 and the precursor zone 804. One or more substrates to be processed may be coupled (e.g., using vacuum-induced suction, electromagnets, clamps, gravity, etc.) to the conveyer system 812 for transportation between the plasma zone 802 and the precursor zone 804. In some embodiments, the substrate itself may be the transportation device (e.g., such as in roll to roll processing).

One of skill in the art, with the benefit of the present disclosure, would understand that a variety of ALD reactors could be used to perform the methods disclosed herein, such as at least some of the reactors disclosed in U.S. Pat. No. 8,187,679, the contents of which are incorporated herein in their entirety.

EXAMPLE 1

Figure 9:
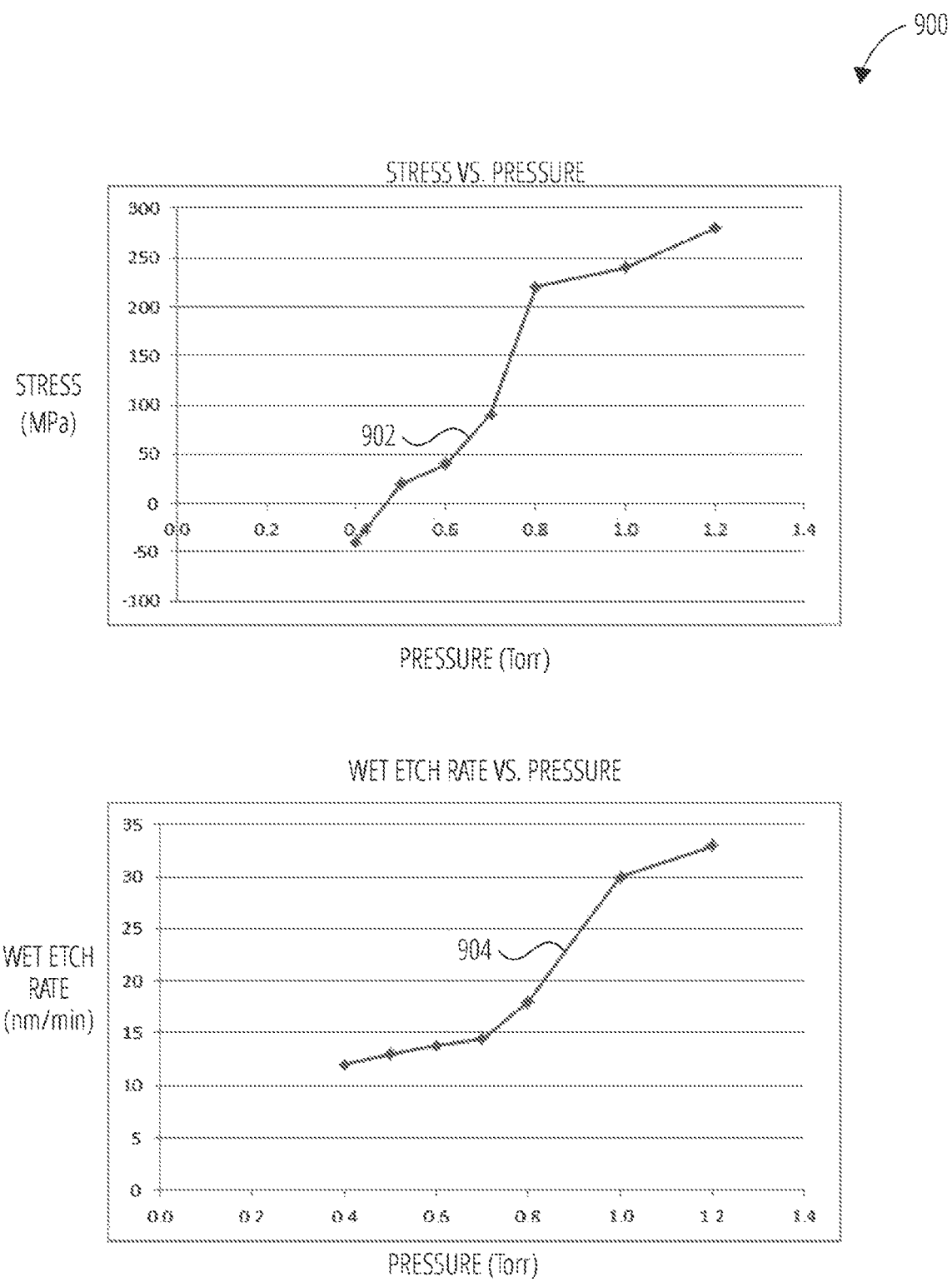
FIG. 9 is a set of plots depicting stress and wet etch rate of films produced according examples disclosed herein.

FIG. 9 is a set of plots 900 illustrating stress and wet etch rate of films produced according to one set of experiments. The films were deposited using a substrate held at 100° C. The substrate was a silicon wafer substrate. DIPAS was used as the precursor gas at room temperature, utilizing vapor draw, and a 0.8 mm orifice restriction. Spatial ALD was used, using a rotary ALD apparatus, similar to the ALD apparatus 700 of FIG. 7, at a rotational speed of 100 rotations per minute (RPM, corresponding to 100 ALD cycles per minute). Power for all runs was held at 300 Watts. A total film thickness deposited was 180 nanometers (nm). A gap between the electrode and the substrate was 1.2 cm.

Pressure was varied from 0.4 Torr to 1.2 Torr to illustrate the influence of pressure on stress and wet etch rate. Although the power was held constant at 300 Watts, the current and voltage provided by the plasma generator varied with the pressure because changes in pressure of the oxygen-containing gas or the nitrogen-containing gas (the process gas) also amounted to changes in electrical impedance of the oxygen-containing gas or the nitrogen-containing gas. As a result, a lower pressure corresponded to a higher voltage and a lower electrical current as compared to a higher pressure, which corresponded to a lower voltage and a higher electrical current. The results of the test are included in Table 1 below.

TABLE 1

| Pressure (Torr) | Current (Amps) | Voltage | Stress (MPa) | Wet Etch Rate (nm/min) |
|---|---|---|---|---|
| 1.2 | 0.5 | 600 | 280 | 33 |
| 1.0 | 0.5 | 640 | 240 | 30 |
| 0.8 | 0.4 | 700 | 220 | 18 |
| 0.7 | 0.4 | 730 | 90 | 14 |
| 0.6 | 0.4 | 770 | 40 | 14 |
| 0.5 | 0.4 | 800 | 20 | 13 |
| 0.4 | 0.3 | 910 | -20 | 12 |

The wet etch rate was measured using 1% absolute HF in water at room temperature. Also, positive stress values in the table correspond to tensile stress, while negative stress values correspond to compressive stress.

The plots 900 include a stress plot 902 illustrating the stress as a function of pressure. As can be seen from the stress plot 902, a substantial increase of tensile stress occurs at 0.8 Torr. As also can be seen from stress plot 902, it is possible to control the stress of the deposited film by selecting an appropriate pressure of the oxygen-containing gas or the nitrogen-containing gas (e.g., to use layers of films to cancel stress or to select a neutral stress of one or more layers).

The plots 900 also include a wet etch rate plot 904 illustrating the wet etch rate as a function of pressure. As can be seen in the wet etch rate plot 904, the wet etch rate increases substantially between 0.8 Torr and 1 Torr. As a result, a higher density of the film results when the pressure of the oxygen-containing gas or the nitrogen-containing gas is at or below 0.8 Torr.

An additional run was made at 1.2 Torr, with the plasma generator operating at 0.5 Amps of current and 600 Volts, but the speed of rotation was cut in half to 50 RPM, effectively doubling the plasma exposure time in the plasma zone. A stress of 120 MPa and a wet etch rate of 24 nm/min were measured. As a result, even when doubling the plasma exposure time in a higher pressure (1.2 Torr) plasma zone, the density of the film is still not as high as that achieved with a lower pressure (e.g., 0.1 Torr to 0.8 Torr) plasma zone. Even when power is increased to 500 Watts (0.74 Amps and 680 Volts) in the 1.2 Torr pressure case, the resulting wet etch rate was 16 nm/min (which is higher than the 14 nm/min wet etch rate achieved at 0.7 Torr in the table) and the stress was 160 MPa.

EXAMPLE 2

Figure 10:
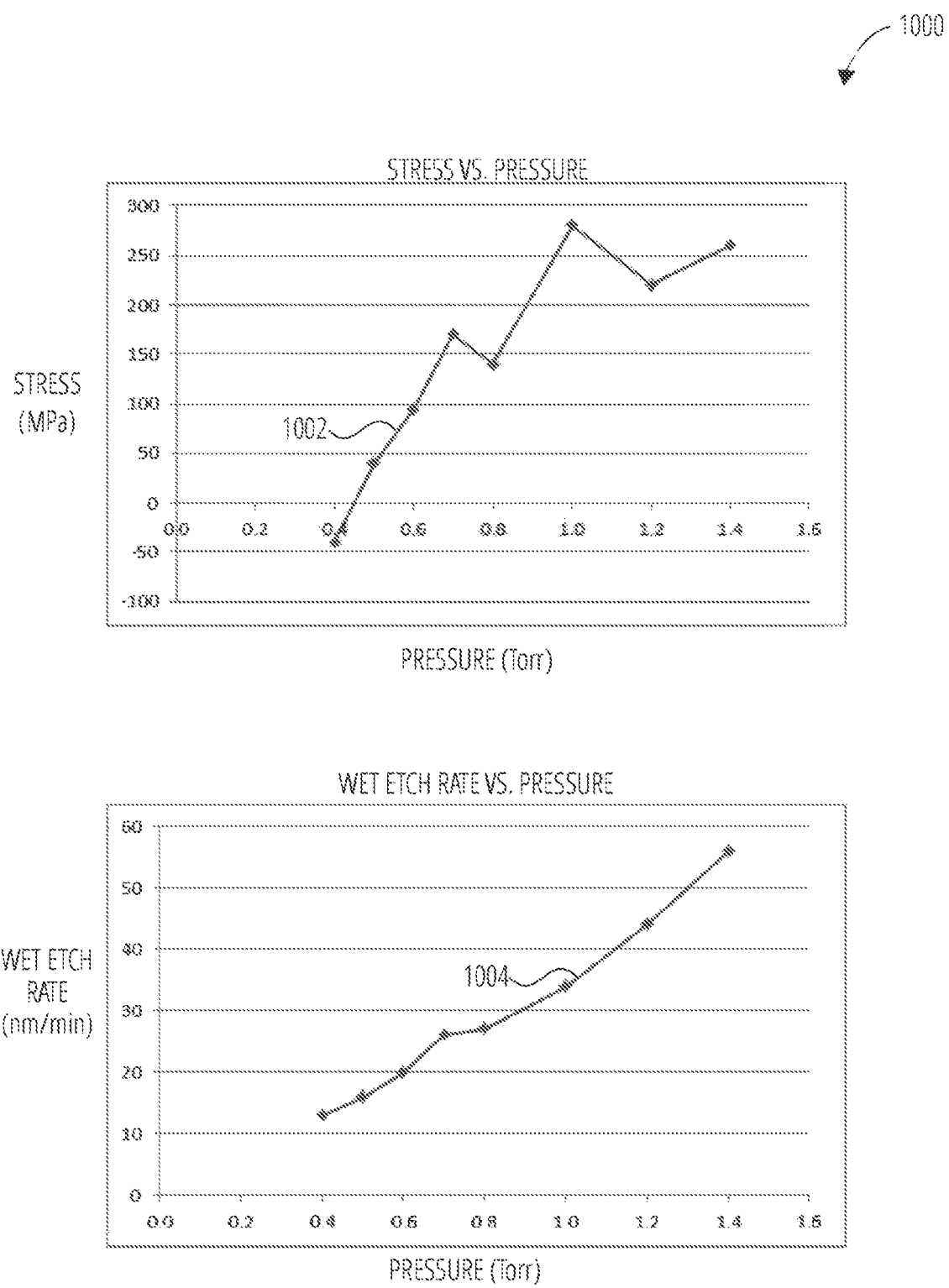
FIG. 10 is a set of plots depicting stress and wet etch rate of films produced according to examples disclosed herein.

FIG. 10 is a set of plots 1000 illustrating stress and wet etch rate of films produced according to another set of experiments. The films were deposited using a silicon wafer substrate held at 80° C. BTBAS was the precursor gas at 50° C. and was delivered using a vapor draw. Spatial ALD was used, using a rotary ALD apparatus, similar to the ALD apparatus 700 of FIG. 7, at a rotational speed of 150 RPM (corresponding to 150 ALD cycles per minute). Power for all runs was held at 500 Watts. A total film thickness deposited was 300 nanometers (nm). The gap between the substrate and the electrode was 1.2 cm.

Pressure was varied from 0.4 Torr to 1.4 Torr to illustrate the influence of pressure on stress and wet etch rate. Although the power was held constant at 500 Watts, the current and voltage provided by the plasma generator varied with the pressure because changes in pressure of the oxygen-containing gas or the nitrogen-containing gas also amounted to changes in electrical impedance of the oxygen-containing gas or the nitrogen-containing gas. As a result, a lower pressure corresponded to a higher voltage and a lower electrical current as compared to a higher pressure, which corresponded to a lower voltage and a higher electrical current. The results of the test are included in Table 2 below.

TABLE 2

| Pressure (Torr) | Current (Amps) | Voltage | Stress (M3a) | Wet Etch Rate (nm/min) |
|---|---|---|---|---|
| 1.4 | 0.8 | 630 | 260 | 56 |
| 1.2 | 0.8 | 660 | 220 | 44 |
| 1.0 | 0.7 | 690 | 280 | 34 |
| 0.8 | 0.7 | 750 | 140 | 27 |
| 0.7 | 0.6 | 780 | 170 | 26 |
| 0.6 | 0.6 | 830 | 95 | 20 |
| 0.5 | 0.6 | 870 | 40 | 16 |
| 0.4 | 0.5 | 980 | -40 | 13 |

The wet etch rate was measured using 1% absolute HF in water at room temperature. Also, positive stress values in the table correspond to tensile stress, while negative stress values correspond to compressive stress.

The plots 1000 include a stress plot 1002 illustrating the stress as a function of pressure. As can be seen from the stress plot 1002, a substantial increase of tensile stress occurs above 0.8 Torr. As also can be seen from stress plot 1002, it is possible to control the stress of the deposited film by selecting an appropriate pressure of the oxygen-containing gas or the nitrogen-containing gas (e.g., to use layers of films to cancel stress or to select a neutral stress of one or more layers).

The plots 1000 also include a wet etch rate plot 1004 illustrating the wet etch rate as a function of pressure. As can be seen in the wet etch rate plot 1004, the rate of change of the wet etch rate increases substantially above 0.8 Torr. As a result, a higher density of the film results when the pressure of the oxygen-containing gas or the nitrogen-containing gas is at or below 0.8 Torr.

EXAMPLE 3

Additional experimentation was conducted to provide further understanding of embodiments disclosed herein. All experiments in this example utilized vapor draw as the delivery mechanism. Table 3 below illustrates how stress of a $SiO_x$ film is relatively resilient to changes in plasma exposure time.

TABLE 3

| Precursor | Cap | Temperature (° C.) | Speed (RPM) | Pressure (Torr) | Current (Amps) | Stress (MPa) |
|---|---|---|---|---|---|---|
| BTBAS | TiO$_2$ | 120 | 150 | 1.1 | 1 | 380 |
| BTBAS | TiO$_2$ | 120 | 120 | 1.1 | 1 | 380 |
| BTBAS | TiO$_2$ | 120 | 60 | 1.1 | 1 | 400 |

As seen in Table 3, through variation speed of rotation of the ALD apparatus from 60 to 150 RPM, the stress measured in the SiO$_2$ film only changed by 10 MPa.

Table 4 below illustrates that only minor changes to stress occur with 3.4 times difference in current (greater than four times change in total power).

TABLE 4

| Precursor | Cap | Temperature (° C.) | Speed (RPM) | Pressure (Torr) | Current (Amps) | Stress (MPa) |
|---|---|---|---|---|---|---|
| BTBAS | TiO$_2$ | 120 | 120 | 1.1 | 1.5 | 290 |
| BTBAS | TiO$_2$ | 120 | 120 | 1.1 | 0.5 | 390 |
| BTBAS | TiO$_2$ | 120 | 120 | 1.1 | 1.7 | 270 |

Table 5 below illustrates that pressure is a key variable in the process. It should be noted that voltage is also a key variable because the voltage changes with the pressure to maintain constant power over the changes in pressure.

TABLE 5

| Precursor | Cap | Temperature (° C.) | Speed (RPM) | Pressure (Torr) | Current (Amps) | Stress (MPa) |
|---|---|---|---|---|---|---|
| BTBAS | TiO$_2$ | 120 | 120 | 1.1 | 1.5 | 240 |
| BTBAS | TiO$_2$ | 120 | 120 | 0.7 | 1.5 | 160 |
| BTBAS | TiO$_2$ | 120 | 120 | 0.5 | 1.0 | 50 |

Table 6 below illustrates another example of how only minor changes to stress occur with changes in plasma exposure time when operating at low pressure and constant power.

TABLE 6

| Precursor | Cap | Temperature (° C.) | Speed (RPM) | Pressure (Torr) | Current (Amps) | Stress (MPa) |
|---|---|---|---|---|---|---|
| BTBAS | TiO$_2$ | 120 | 120 | 0.3 | 0.5 | 60 |
| BTBAS | TiO$_2$ | 120 | 150 | 0.5 | 1 | 30 |
| BTBAS | TiO$_2$ | 120 | 180 | 0.5 | 1 | 40 |

A control experiment was run to test the wet etch rate of SiO$_2$ films. In the control experiment a BTBAS precursor was used at a temperature of 100° C. at a speed of 120 RPM, a pressure of 1 Torr, a current of 1 Amp, and a voltage of 475 Volts. A wet etch rate of 650 Angstroms per minute (A/min) was measured as a result. Four additional experiments conducted within the pressure range of embodiments of the disclosure (0.1 Torr to 0.8 Torr) were also run, which are summarized in Table 7.

TABLE 7

| Precursor | Temperature (° C.) | Speed (RPM) | Pressure (Torr) | Current (Amps) | Wet Etch Rate (A/min) |
|---|---|---|---|---|---|
| BTBAS | 120 | 60 | 0.5 | 1 | 140 |
| BTBAS | 120 | 60 | 0.45 | 1 | 140 |
| BTBAS | 120 | 60 | 0.4 | 1 | 140 |
| BTBAS | 120 | 60 | 0.35 | 1 | 150 |

As seen in Table 7, density is not modulated greatly by decreases in pressure below 0.8 Torr.

Table 8 illustrates that maintaining a high voltage is important.

TABLE 8

| Precursor | Temperature (° C.) | Speed (RPM) | Pressure (Torr) | Voltage (Volts) | Current (Amps) | Wet Etch Rate (Å/min) |
|---|---|---|---|---|---|---|
| BTBAS | 120 | 30 | 0.5 | 850 | 1 | 130 |
| BTBAS | 120 | 60 | 0.5 | 950 | 1.5 | 130 |
| BTBAS | 120 | 60 | 0.5 | 600 | 0.5 | >270 |
| BTBAS | 120 | 60 | 0.3 | 860 | 0.5 | 170 |

In Table 8 the wet etch rate of >270 indicates that all of the film was etched, so an actual wet etch rate could not be determined.

EXAMPLE 4

Tables 3-8 were all based on SiO$_2$ films. Table 9 shows results from experiments for TiO$_x$ films made from TTIP as the gaseous metal precursor and O$_2$ as the oxygen-containing gas for the plasma.

TABLE 9

| Precursor | Temperature (° C.) | Speed (RPM) | Pressure (Torr) | Current (Amps) | Voltage (Volts) | Stress (MPa) |
|---|---|---|---|---|---|---|
| TTIP | 100 | 120 | 1.0 | 0.7 | 440 | 440 |
| TTIP | 100 | 120 | 0.4 | 0.7 | 920 | 40 |

Table 9 illustrates that much less stress results from operating within the pressure range (0.1 Torr to 0.8 Torr) of the present disclosure.

EXAMPLE 5

Table 10 illustrates stress and wet etch rate of SiO$_x$ films deposited using precursors other than BTBAS.

TABLE 10

| | Precursor | Temperature (° C.) | Speed (RPM) | Pressure (Torr) | Current (Amps) | Stress (MPa) | Wet Etch Rate (Å/min) |
|---|---|---|---|---|---|---|---|
| Vx-51 | Orthrus | 200 | 150 | 0.5 | 0.8 | | 130 |
| Vx-52 | BDIPADS | 200 | 150 | 0.5 | 0.75 | 0 | 170 |
| Vx-53 | Orthrus | 200 | 150 | 0.5 | 0.7 | 40 | 130 |

TABLE 10-continued

| | Precursor | Temperature (° C.) | Speed (RPM) | Pressure (Torr) | Current (Amps) | Stress (MPa) | Wet Etch Rate (Å/min) |
|---|---|---|---|---|---|---|---|
| Vx-38 | DIPAS | 200 | 120 | 0.5 | 0.65 | −50 | 110 |
| Vx-60 | DIPAS | 20 | 120 | 0.5 | 0.65 | 0 | 140 |

As can be seen from Table 10, good stress and wet etch rates were obtained for $SiO_x$ films deposited using each of the precursors of Table 10.

EXAMPLE 6

Experiments were conducted with a substrate temperature of 100° C. using a diisopropylaminosilane (DIPAS) precursor at room temperature. The precursor was passively delivered via evaporation through a 0.8 mm diameter restrictive orifice. For all runs, the power was held constant at approximately 300 Watts with an electrode surface area of approximately 135 square centimeters (resulting in a surface power density of 2.22 Watts per square centimeter). Pure oxygen was used as the plasma and purge gas, and the flow was varied to vary the chamber pressure. The substrate used was DuPont Teijin Mellinex ST-504, 125 microns thick. No cleaning or pretreatment was applied to the substrate material prior to the ALD runs. Water vapor transmission rate (WVTR) was measured using an Illinois Instruments Model 7001 Water Vapor Permeation Analyzer, with test conditions of 38° C., 90% relative humidity. The WVTR of the uncoated substrate is approximately 5 $g/m^2$/day. ALD coating thickness was determined by measuring a silicon witness coupon using a Rudolph EL-III ellipsometer.

Experiment 1: $O_2$ flow rate was 420 SCCM, resulting in a chamber pressure of 0.5 Torr. The plasma voltage averaged approximately 810 V. 485 rotations at 100 RPM resulted in a thickness of 450 Angstroms. The WVTR of this sample measured below the specified sensitivity of the instrument, which is 0.003 $g/m^2$/day.

Experiment 2: $O_2$ Flow rate was 1600 SCCM, resulting in a chamber pressure of 1.2 Torr. The plasma voltage averaged approximately 580 V. 485 rotations at 100 RPM resulted in a thickness of 500 Å. The WVTR of this sample measured 4.4 $g/m^2$/day.

Experiment 3: $O_2$ Flow rate was 1600 SCCM, resulting in a chamber pressure of 1.2 Torr. The plasma voltage averaged approximately 580 V. 485 rotations at 50 RPM resulted in a thickness of 460 Å. The WVTR of this sample measured 1.55 $g/m^2$/day.

CONCLUSION

Those having ordinary skill in the art will understand that many variations of the embodiments disclosed herein may be made without departing from the scope of the disclosure. The scope of the present invention should, therefore, be determined only by the following claims.

What is claimed is:

1. A method of performing atomic layer deposition, the method comprising the steps of:
   placing a substrate proximal an electrode so that the electrode and the substrate are spaced apart to leave a gap therebetween;
   exposing the substrate to a process gas at a pressure at or below 0.8 Torr while applying a voltage of at least 700 Volts to the electrode at a frequency less than 500 kHz to induce in the process gas a plasma that occupies the entire gap, the process gas being selected from the group consisting of an oxygen-containing gas, a nitrogen-containing gas, and mixtures thereof; and
   exposing the substrate to a gaseous metal-containing precursor.

2. The method of claim 1, wherein the pressure is approximately 0.1 Torr.

3. The method according to claim 1, wherein the voltage applied to the electrode is a constant or pulsed DC voltage of between 700 Volts and 1500 Volts.

4. The method according to claim 1, wherein the voltage applied to the electrode has a frequency of less than 100 kHz.

5. The method according to claim 1, wherein, after exposing the substrate to the gaseous metal-containing precursor, further comprising the steps of:
   (a) exposing the substrate to the process gas at a first pressure at or below 0.8 Torr while applying a voltage of at least 700 Volts and frequency less than 500 kHz to the electrode to form on the substrate a first film having a first type of stress;
   (b) after step (a), again exposing the substrate to the metal-containing precursor;
   (c) during a period of time between and including steps (a) and (d), modulating the pressure of the process gas between the first pressure and a second pressure also at or below 0.8 Torr but different from the first pressure; and
   (d) after step (b), exposing the substrate to the process gas at the second pressure while applying a voltage of at least 700 Volts and frequency less than 500 kHz to the electrode to form over the first film a second film having a second type of stress that is different from the first type of stress.

6. The method according to claim 5, wherein the voltage applied to the electrode in steps (a) and (d) is varied in coordination with the modulating of the pressure of the process gas.

7. The method of claim 5, wherein the second pressure is selected so that the second type of stress at least partially counteracts the first type of stress.

8. The method according to claim 1, further comprising:
   alternating the steps of exposing the substrate to the process gas and exposing the substrate to the gaseous metal-containing precursor multiple times, to grow on the substrate a metal oxide film, a metal nitride film, or combinations thereof.

9. The method according to claim 1, wherein the gaseous metal-containing precursor comprises an amino-based silicon precursor.

10. The method according to claim 1, wherein the electrode is separated from the substrate by 5 cm or less.

11. The method according to claim 1, wherein the voltage is applied with a constant power or a constant average power over time.

12. The method according to claim 11, wherein the electrode is coupled to a high-power pulsed magnetron sputtering (HIPIMS) power supply, and the step of applying the voltage includes the HIPIMS power supply applying a pulsed DC voltage to the electrode.

13. The method according to claim 1, wherein the process gas is unreactive with the metal-containing precursor when the process gas is not radicalized as the plasma.

14. The method according to claim 1, wherein the process gas is a first process gas, and further comprising:
- after exposing the substrate to the metal-containing precursor, transporting the substrate to a position proximal to a second electrode so that the second electrode and the substrate are spaced apart to leave a second gap therebetween;
- while the substrate is proximal to the second electrode, exposing the substrate to a second process gas at a second pressure at or below 0.8 Torr that is different from the pressure of the first process gas, the second process gas being selected from the group consisting of an oxygen-containing gas, a nitrogen-containing gas, and mixtures thereof; and
- applying a voltage of at least 700 Volts to the second electrode while exposing the substrate to the second process gas, to induce in the second process gas a second plasma that occupies the entire second gap.

15. A thin film deposition method comprising the steps of:
forming on the substrate a first film of a metal oxide, a metal nitride, or combinations thereof having a first type of stress, the first film being formed by the steps of:
- (a) placing a substrate into an atomic layer deposition reactor proximal to a first electrode that is coupled to a power supply, the substrate being spaced apart from the first electrode to leave a gap therebetween;
- (b) introducing into the atomic layer deposition reactor a first process gas at a first pressure at or below 0.8 Torr and operating the power supply to apply power to the first electrode having a first voltage of at least 700 Volts and frequency less than 500 kHz to induce in the process gas a first plasma that occupies the entire gap between the first electrode and the substrate, wherein the first process gas is selected from the group consisting of an oxygen-containing gas, a nitrogen-containing gas, and mixtures thereof; and
- (c) after step (b), exposing the substrate to a first gaseous metal-containing precursor;
- (d) alternating steps (b) and (c) multiple times;

forming over the first film a second film of a metal oxide, a metal nitride, or combinations thereof having a second stress that is different in type or amount from the first stress, the second film being formed by the steps of:
- (e) transporting the substrate to a position proximal to a second electrode so that the second electrode and the substrate are spaced apart to leave a second gap therebetween;
- (f) exposing the substrate to a second process gas at a second pressure at or below 0.8 Torr that is different from the first pressure while applying power to the second electrode to induce a plasma state in the second process gas proximal to the substrate, the power applied to the second electrode having a second voltage different from the first voltage and a frequency less than 500 kHz, wherein the second process gas is selected from the group consisting of an oxygen-containing gas, a nitrogen-containing gas, and mixtures thereof;
- (g) after step (f), exposing the substrate to the first gaseous metal-containing precursor or a second gaseous metal-containing precursor; and
- (h) alternating steps (f) and (g) multiple times.

16. The method according to claim 15, wherein the first electrode is separated from the substrate by 5 cm or less.

17. The method according to claim 15, wherein the first film and the second film together form a final thin film, and the first and second pressures are selected to result in the final thin film having a tensile stress less than 200 MPa or a compressive stress less than −200 MPa.

18. The method according to claim 15, wherein the power supply is a continuous DC power supply or a pulsed DC power supply.

19. The method according to claim 15, wherein the first voltage and the second voltage are both applied at the same constant power or the same average power over time.

20. The method according to claim 15, wherein applying the first voltage to the first electrode includes applying constant or pulsed DC voltage of between 700 Volts and 1500 Volts, and applying the second voltage to the second electrode includes applying constant or pulsed DC voltage of between 700 Volts and 1500 Volts.

21. The method according to claim 15, wherein at least one of the first and second gaseous metal-containing precursors is an amino-based silicon precursor.

* * * * *